(12) United States Patent
Goorjian

(10) Patent No.: US 11,159,247 B1
(45) Date of Patent: Oct. 26, 2021

(54) OPTICAL COMMUNICATION SYSTEM AND METHOD USING LASER ARRAYS

(71) Applicant: United States of America as Represented by the Administrator of NASA, Washington, DC (US)

(72) Inventor: Peter Mike Goorjian, Oakland, CA (US)

(73) Assignee: United States of Americas as Represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/778,946

(22) Filed: Jan. 31, 2020

(51) Int. Cl.
| | |
|---|---|
| H04B 10/00 | (2013.01) |
| H04B 10/67 | (2013.01) |
| H04B 10/118 | (2013.01) |
| H01S 5/183 | (2006.01) |
| H04B 10/112 | (2013.01) |
| H04B 10/50 | (2013.01) |

(52) U.S. Cl.
CPC .......... *H04B 10/67* (2013.01); *H01S 5/183* (2013.01); *H04B 10/118* (2013.01); *H04B 10/1123* (2013.01); *H04B 10/503* (2013.01)

(58) Field of Classification Search
CPC ............ H04B 10/112; H04B 10/1123; H04B 10/1125; H04B 10/118; H04B 10/114; H04B 10/1143; H04B 10/1149; H04B 10/116; H04B 10/40; H04B 10/1127; H04B 10/1129; G01J 1/4257

USPC ....... 398/118, 119, 120, 122, 123, 124, 125, 398/127, 128, 129, 130, 131, 135, 136, 398/115, 169, 170, 158, 159

See application file for complete search history.

(56) References Cited

U.S. PATENT DOCUMENTS

| | | | | |
|---|---|---|---|---|
| 6,154,299 | A * | 11/2000 | Gilbreath | H04B 10/118 398/170 |
| 7,983,565 | B2 * | 7/2011 | Varshneya | G01S 17/10 398/118 |
| 9,774,395 | B1 | 9/2017 | Goorjian | |
| 9,954,613 | B1 * | 4/2018 | Goorjian | H04B 10/1123 |

OTHER PUBLICATIONS

Alberto, A. G. et al., "Modulating Retro-Reflectors: Technology, Link Budgets and Applications", 63rd International Astronautical Congress, paper IAC-12, B4,6B,1, Oct. 1-5, 2012, Naples, Italy, 6 pages.

(Continued)

*Primary Examiner* — Hanh Phan
(74) *Attorney, Agent, or Firm* — Rhys W. Cheung; Robert M. Padilla; Helen M. Galus

(57) ABSTRACT

A method and system for optical communication with between a device and a remote station include passing light incoming from the remote station and outgoing to the remote station through a lens system and an aperture of the device, for example the lens system comprising a Plössl lens or a double-Gauss lens. The method and device include receiving the incoming light at an optoelectronic assembly that has an array of VCSELs, an array of microlenses, and a plurality of photodetectors configured to generate an output signal in response to detected light. The VCSELs may be arranged in clusters for simultaneous emission, and multiple clusters may also be activated for simultaneous emission.

18 Claims, 23 Drawing Sheets
(16 of 23 Drawing Sheet(s) Filed in Color)

(56) References Cited

OTHER PUBLICATIONS

Biswas, A. et al., "Deep Space Optical Communications", Proc. of SPIE vol. 10524, 105240U, 2018, X pages.
Carson, R. F. et al., TriLumina Corp. "Compact VCSEL-based laser array communications systems for improved data performance in satellites", Proc. of SPIE vol. 9226, 92260H, 2014, 12 pages.
Carson, R. F. et al., TriLumina Corp. "Progress in High-Power, High-Speed VCSEL Arrays", Proc. of SPIE vol. 9766, 97660B, 2016, 15 pages.
Choquette, K, D. et al., "2-Dimensional Integrated VCSEL and PiN Photodetector Arrays for a Bidirectional Optical Links", IEEE Aerospace Conference, IEEEAC paper #1042, Jan. 2, 2007, 7 pages.
Edmund Optics Inc., https://www.edmundoptics.com/, accessed Nov. 18, 2019, 5 pages.
Giannopoulos, A. V., Kasten, A. M., Long, C. M., Chen, C., and Choquette, K, D. "Two-dimensional integration of a vertical-cavity surface-emitting laser and photodetectors for position sensing," Applied Optics, vol. 47, No. 25, Sep. 2008, 5 pages.
Keck Institute for Space Studies (KISS) workshop "Optical Communication on SmallSats—Enabling the Next-Era in Space Science", Jul. 11-14, 2016 and Feb. 2-9, 2017 at CIT, Pasadena, CA, 7 pages.
MacEvoy, B., Astronomical Optics, Part 1, Basic Optics, http://www.handprint.com/ASTRO/ae1.html, revised Nov. 26, 2013, 27 pages.
Marigo-Lombart, L. et al., "Integration of Electro-Absorption Modulator in a Vertical-Cavity Surface-Emitting Laser", Proc. of SPIE vol. 10552, 105520L, 2018, 8 pages.
Mirrorcle Technologies, Inc, MEMS Mirrors, https://www.mirrorcletech.com/wp/products/mems-mirrors/, accessed Nov. 14, 2015, 6 pages.
Moench, H.. et al., "High power VCSEL systems and applications", Proc. of SPIE vol. 9348, 93480W, 2015, 11 pages.
Optotune Switzerland AG, 2D Beam Steering, https://www.optotune.com/products/beam-steering, accessed Nov. 14, 2019, 2 pages.
Robinson, B. S. et al., "TeraByte InfraRed Delivery (TBIRD): A Demonstration of Large-Volume Direct-to-Earth Data Transfer from Low-Earth Orbit", Proc. of SPIE vol. 10524, 105240V, 2018, 7 pages.
Rose, T.S., et al., "Optical Communications Downlink from a 1.5U CubeSat: OCSD Program", Proceedings of the 32nd AIAA/USU Conference on Small Satellites, Session 11: Assuring the Space Ecosystem I, SSC18-XI-10, Aug. 4-9, 2018, 15 pages.
Rose, T.S., et al., Optical Communications Downlink from a 1.5U CubeSat: OCSD Program, The Aerospace Corporation, Los Angeles, CA, Aug. 4-9, 2018, 11 pages.
Trumpf Inc., https://www.trumpf.com/en_US/products/vcsel-solutions-photodiodes/, accessed Nov. 18, 2019, 3 pages.
Velazco, J. E. et al., "High data rate inter-satellite Omnidirectional Optical Communicator", Proceedings of the 32nd AIAA/USU Conference on Small Satellites, Session 1: Advanced Concepts I: SSC18-WKI-02, Aug. 4-9, 2018, 30 pages.
Velazco, J. E. et al., "High data rate inter-satellite Omnidirectional Optical Communicator", Proceedings of the 32nd AIAA/USU Conference on Small Satellites, Session 1: Advanced Concepts I: SSC18-WKI-02, Aug. 4-9, 2018, 5 pages.
Warren, M. E. et al., TriLumina Corp. "High-speed and scalable high-power VCSEL arrays and their applications", Proc. of SPIE vol. 9381, 93810C, 2015, 16 pages.
Ye, L. et al., "Large-Aperture kHz Operating Frequency Ti-alloy Based Optical Micro Scanning Mirror for LiDAR Application", Micromachines, 8, 120; doi:10.3390/mi8040120, Apr. 10, 2017, 14 pages.
Zaman, I.U. et al., "Design Tradeoffs and Challenges of Omnidirectional Optical Antenna for High Speed, Long Range Inter CubeSat Data Communication", Proceedings of the 32nd AIAA/USU Conference on Small Satellites, Session 2: Delivering Mission Success: SSC18-WKII-06, Aug. 4-9, 2018, 7 pages.
Zaman, I.U. et al., "Design Tradeoffs and Challenges of Omnidirectional Optical Antenna for High Speed, Long Range Inter CubeSat Data Communication", Proceedings of the 32nd AIAA/USU Conference on Small Satellites, Session 2: Delivering Mission Success: SSC18-WKII-06, Aug. 4-9, 2018, 14 pages.
Zemax LLC, https://www.zemax.com/, accessed Nov. 18, 2019, 9 pages.

* cited by examiner

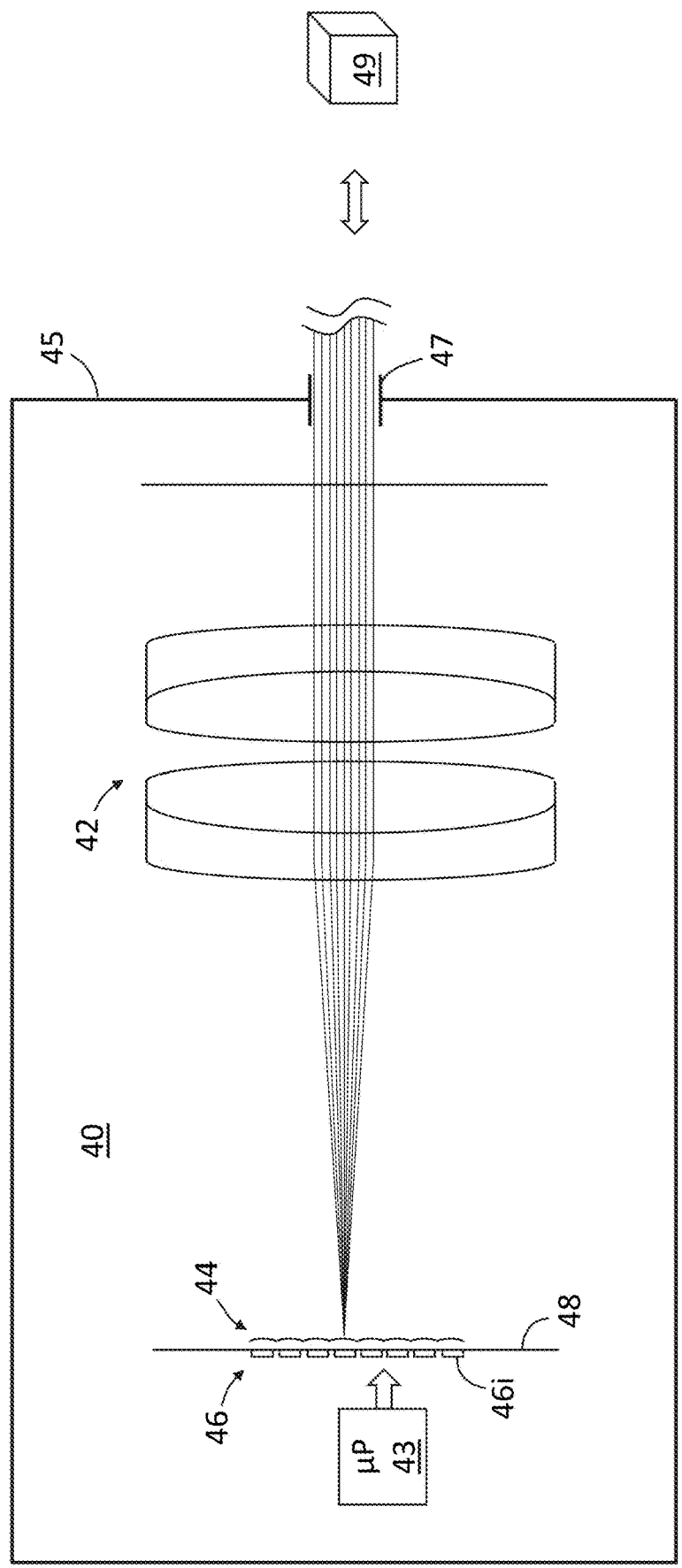

OPTICAL COMMUNICATION SYSTEM AND METHOD USING LASER ARRAYS

ORIGIN OF THE INVENTION

The invention described herein was made by (an) employee(s) of the United States Government and may be manufactured and used by or for the Government of the United States of America for governmental purposes without the payment of any royalties thereon or therefor.

FIELD OF THE INVENTION

The present disclosure relates generally to optical communication at long distances.

BACKGROUND OF THE INVENTION

In previous approaches, optical communication between objects is conducted by directing an interrogating laser beam from, for example, a terrestrial station to a satellite orbiting the earth. At the satellite, the beam is encoded with information of interest and retroreflected back to the terrestrial station. Alternatively, a new encoded beam is emitted from the satellite, rather than retroreflecting the original beam, whose strength and other attributes may be significantly degraded over the length of its journey. These approaches are described in detail in U.S. Pat. Nos. 9,774,395 and 9,954,613 to Goorjian, the disclosures of which are incorporated herein by reference in their entirety.

SUMMARY

A system is described for optical data transmissions from satellites using laser arrays for laser beam pointing. It is simple, static, and compact, and provides accurate pointing, acquisition, and tracking (PAT). In certain embodiments, it combines a lens system and a VCSEL/Photodetector Array in a novel way for PAT. It can improve the PAT system's size, weight, and power (SWaP) in comparison to current systems.

A small telescope can be incorporated into the lens system to make the steering finer and consequently be applicable to transmissions between satellites in low-Earth orbit (LEO) and ground terminals.

Laser beam pointing is very challenging for LEO, including science missions. The arrangements of some embodiments of the invention comprising a static, less complex system described herein can replace current architectures that use dynamical systems (i.e., moving parts, fast-steering mirrors (FSM), and/or gimbals) and/or vibration isolation platforms to turn the laser to point to the ground terminal. The novel arrangement achieves diffraction-limited beam propagation. Further, whereas for conventional electro-optical systems, reaction times to pointing changes and vibrations are on the nanosecond time scale, the arrangement herein is much faster. In addition, for LEO terminals, slew rates are not a concern with the new system.

Possible additional applications of some embodiments are directed to planetary distances (deep space optical communications, DSOC), and to optical multiple access (OMA), since laser beams from different sources come in at different angles and then are mapped to different photodetectors. As a result, different beams can be sent back to different sources. Another application of some embodiments is directed to communication among a constellation of close satellites, which is similar to OMA.

Also, the system described herein is applicable to satellites that use modulating retro-reflectors by increasing the returning beam power. Current planned architectures envision a high-powered laser at the ground terminal and a modulating retro-reflector at the satellite. The retro-reflector can be replaced with a VCSEL array in the satellite for a strong return response to a weak signal laser beam. This replacement allows for the use of low power lasers at the ground terminal. Also, backscatter, often a limiting factor with a retro-reflected beam, is reduced by using a weaker laser beam from the ground and returning a strong response signal from the satellite.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated into and constitute a part of this specification, illustrate one or more examples of embodiments and, together with the description of example embodiments, serve to explain the principles and implementations of the embodiments.

Figure 1:
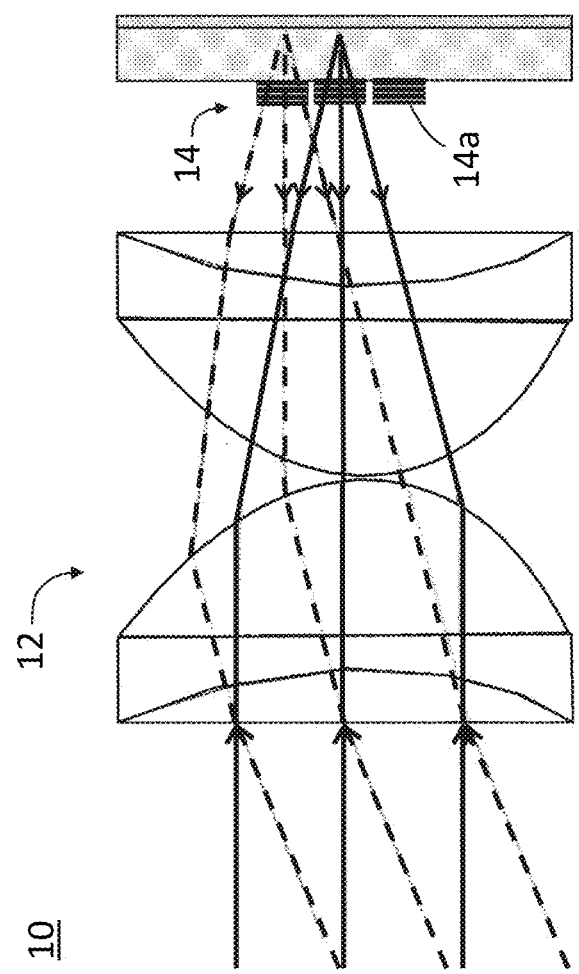
Figure 2:
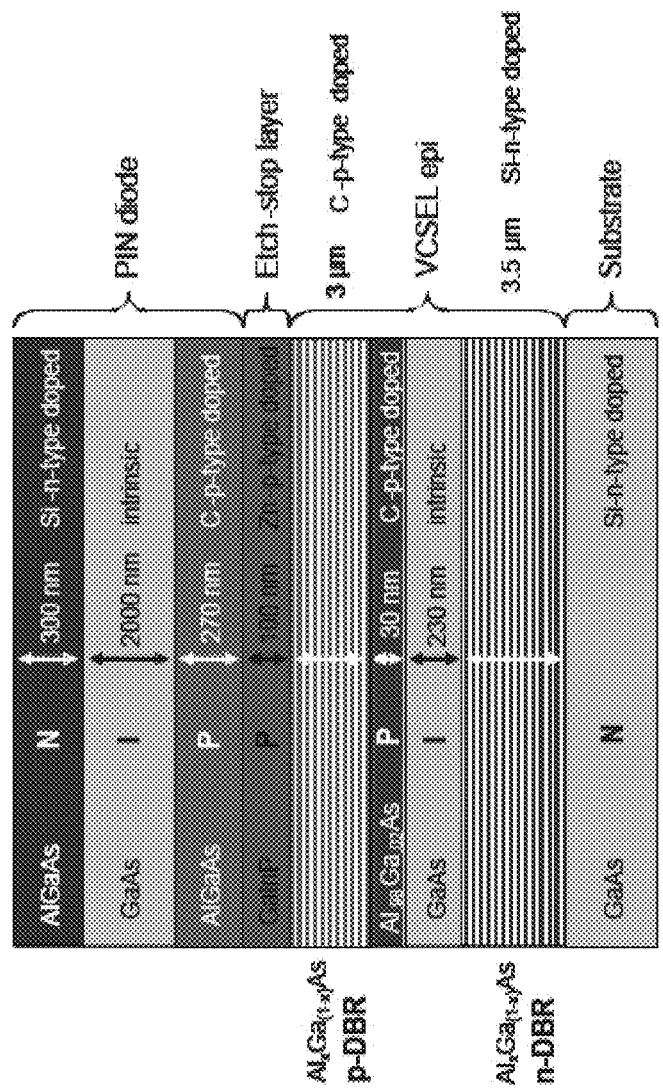
Figure 3:
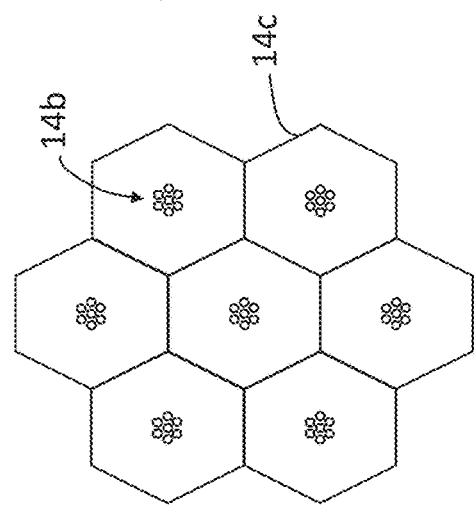
Figure 4:
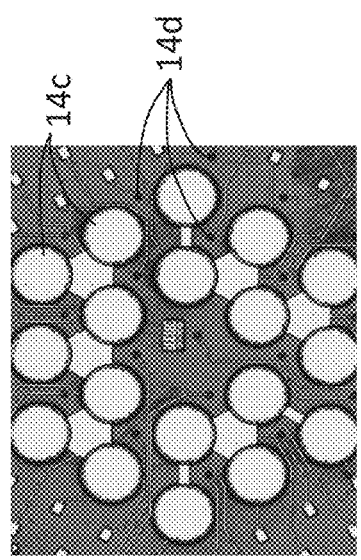
Figure 5:
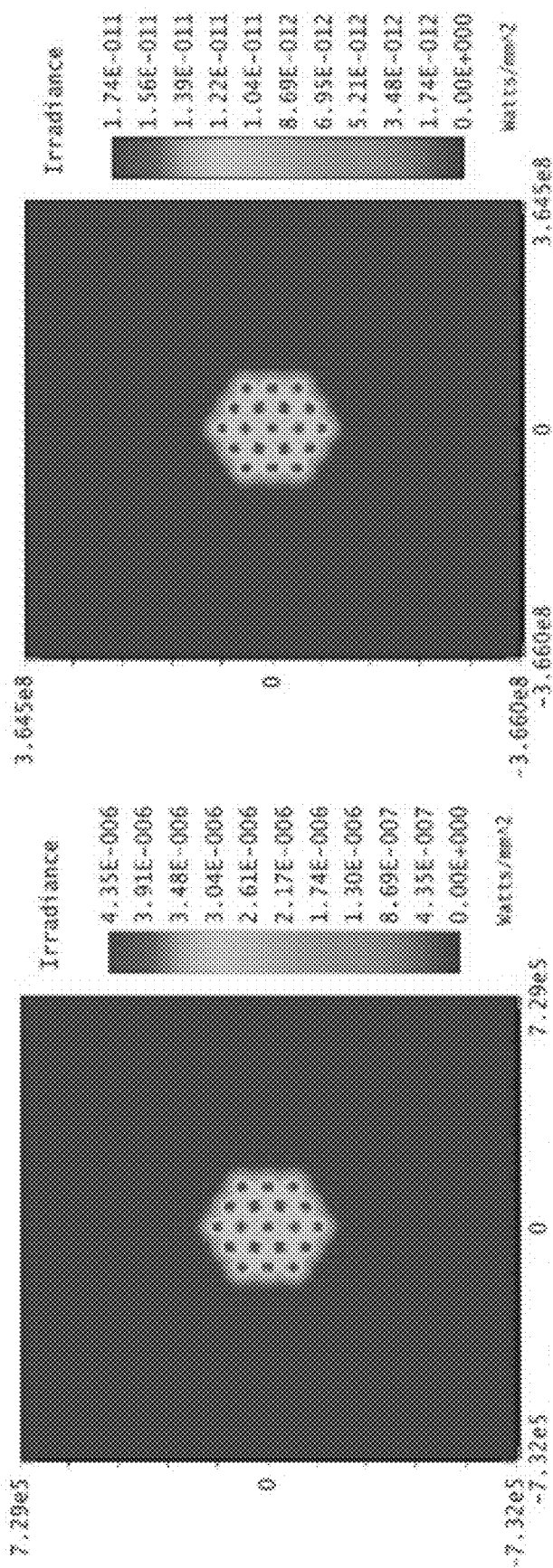
Figure 6:
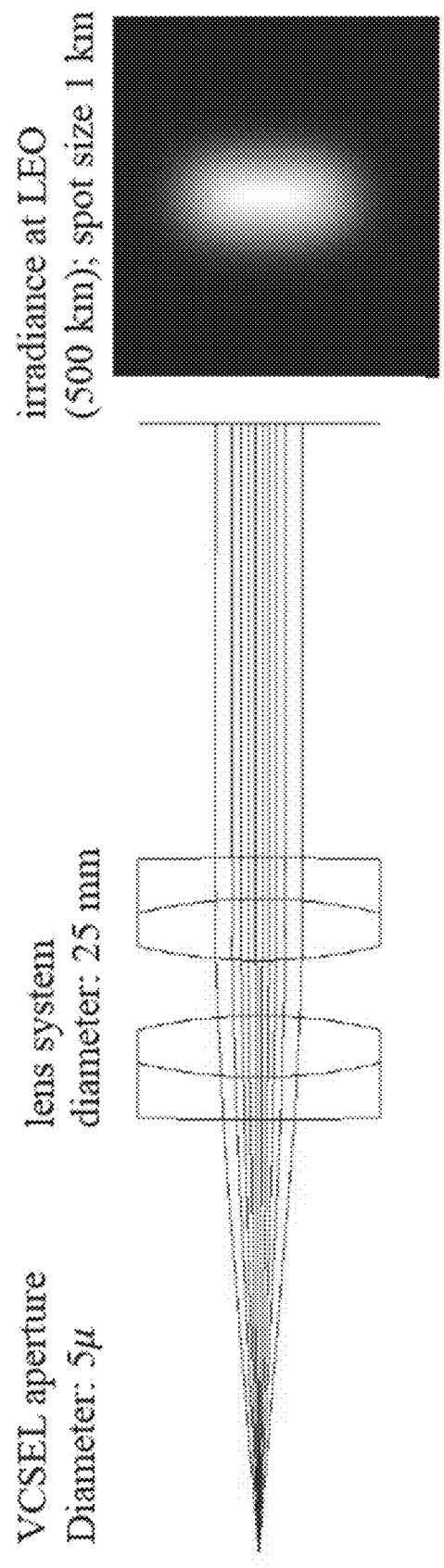
Figure 7:
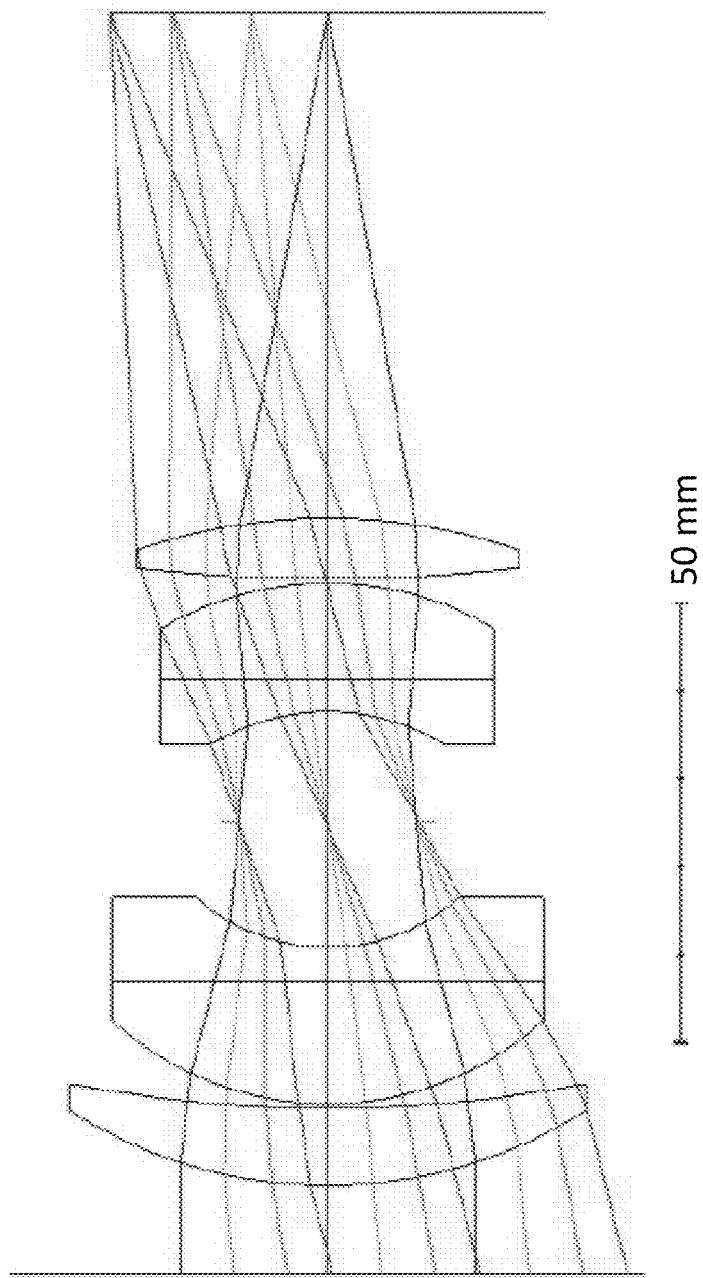
Figure 8:
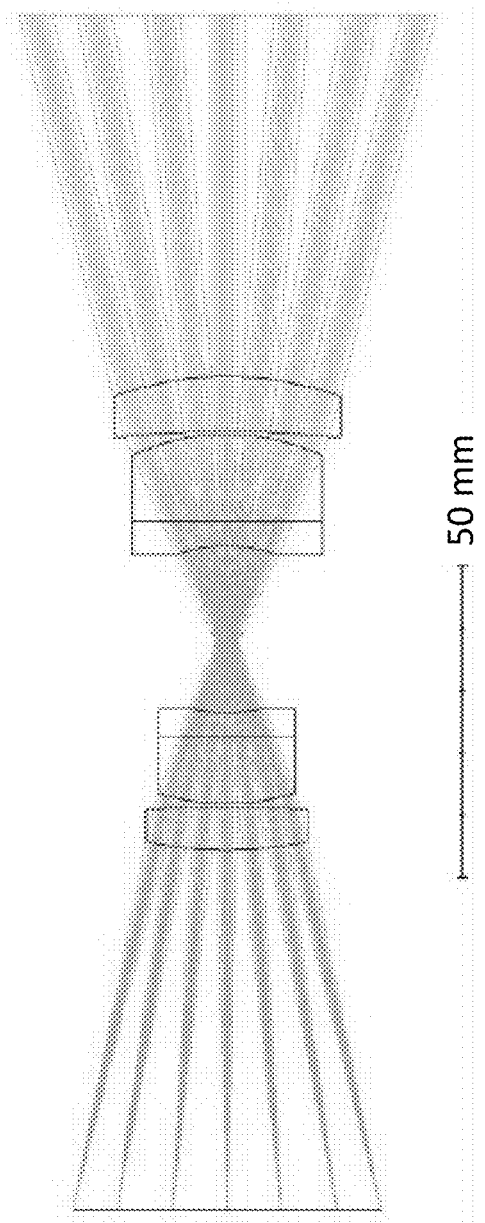
Figures 9A, 9B:
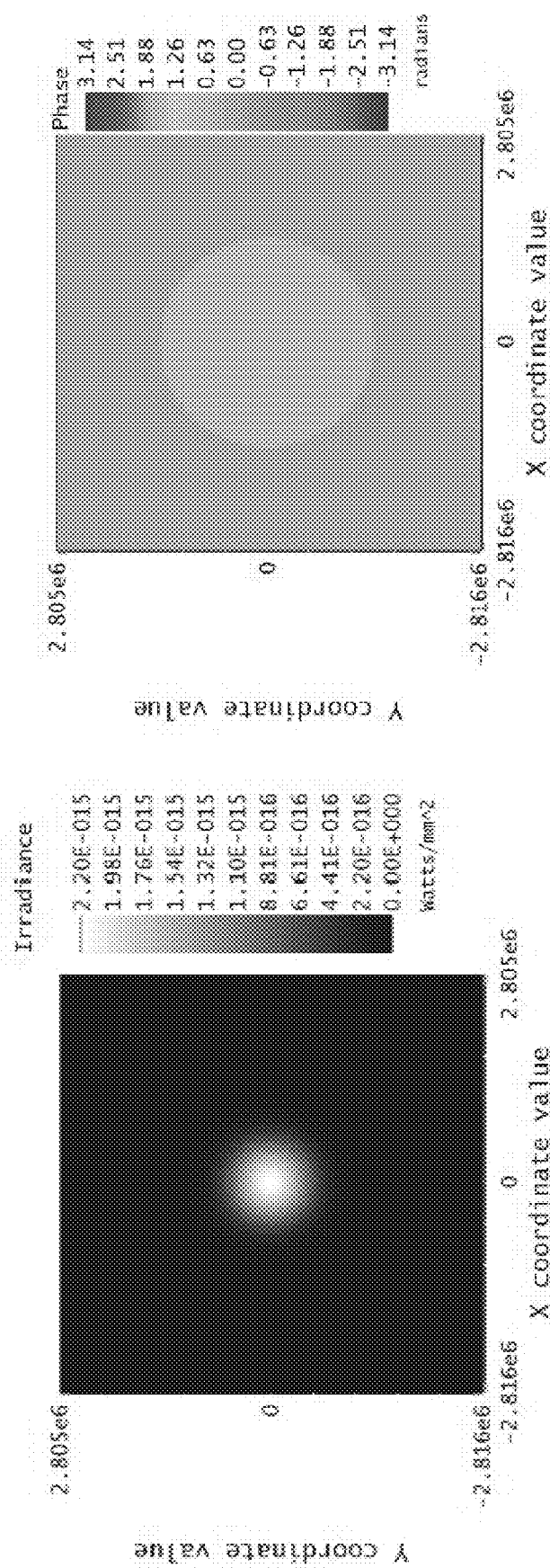
Figures 10A, 10B:
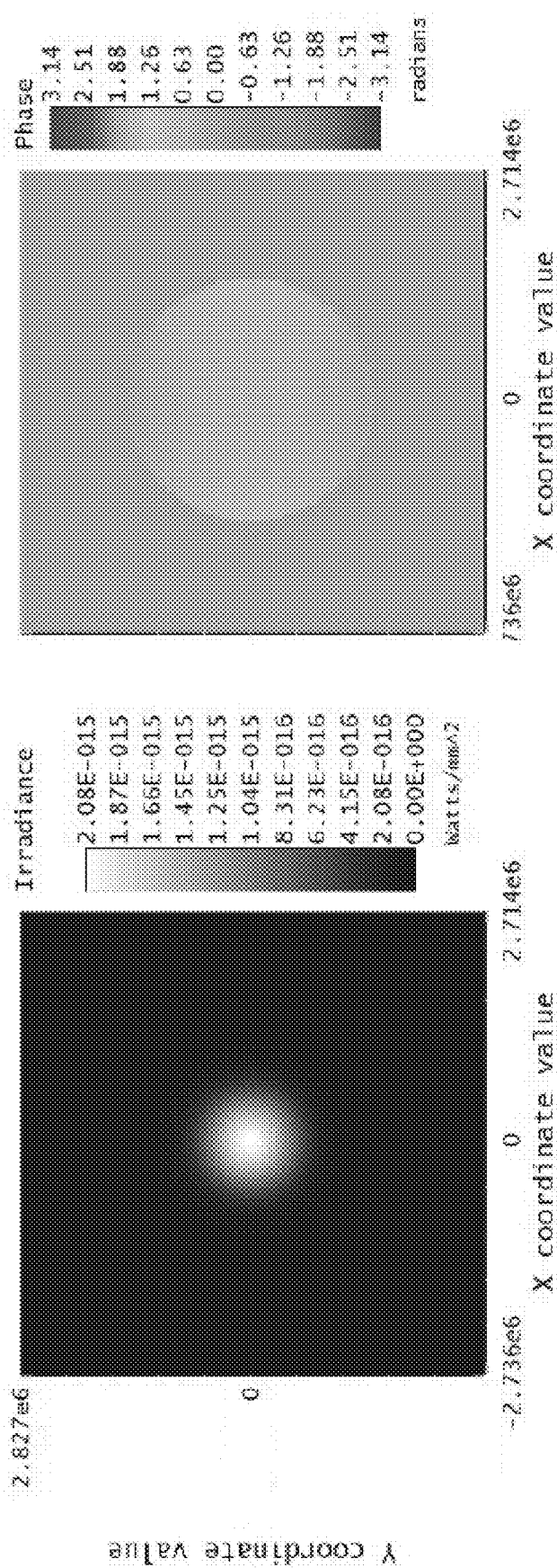
Figures 11A, 11B:
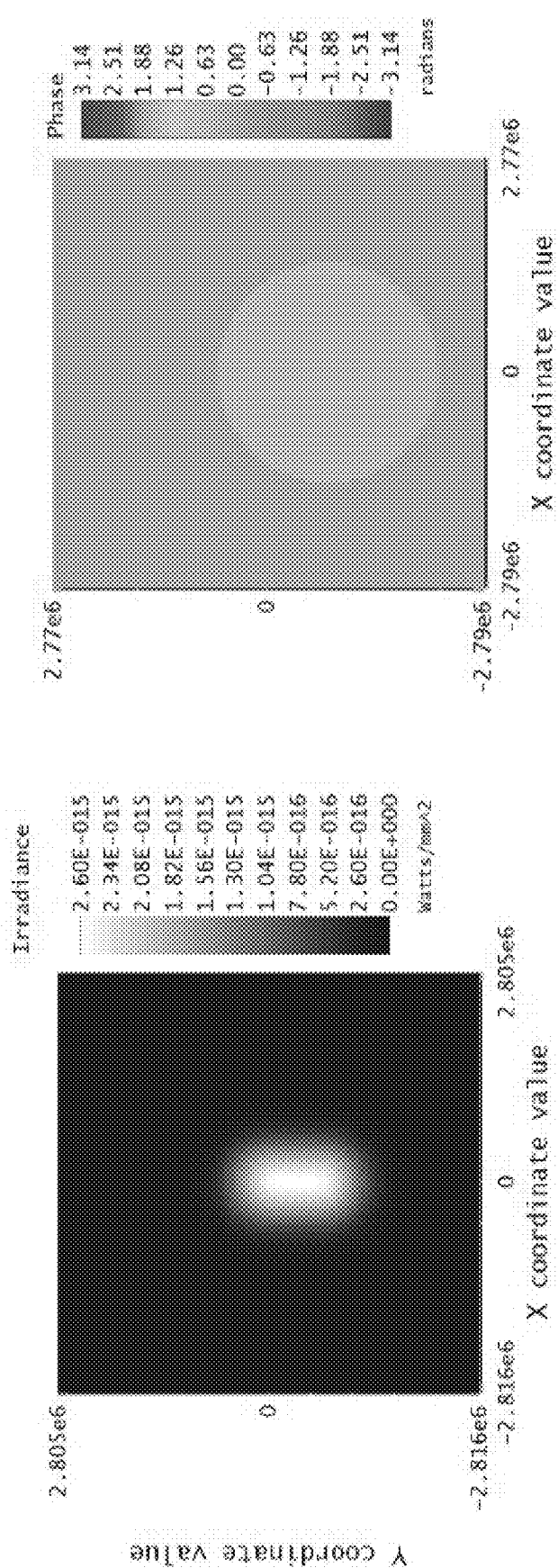

In the drawings, according to some embodiments:

FIG. 1 schematically shows a system in which a signal laser beam, transmitted from a ground terminal on the left, enters a lens system and is directed thereby to an element of a pixel array disposed at the focal plane;

FIG. 2 is an epi-structure view of a VCSEL/photodetector array;

FIG. 3 is a diagram of a VCSEL/photodetector array pattern in accordance with certain embodiments;

FIG. 4 is top-view of a 37-element VCSEL/PIN detector array;

FIG. 5 shows a simulation of the wave front of a 19-laser beam cluster at propagation distances of 1 km and 500 km;

FIG. 6 shows schematically propagation through a relay lens system (diffraction limited) of two overlapping laser beams;

FIG. 7 shows a Double Gauss 28° Field Lens system and the focusing at the focal plane of four beams (colors) that are incoming from the left side at different angles, including 0° (blue) and 14° (red). Each beam enters as collimated;

FIG. 8 shows laser beams being emitted from lasers at the focal plane and propagating out of the double Gauss 28° field lens system at several angles, including those at 0° and 14°;

FIGS. 9a and 9b show the irradiance and phase of a wave front at 611 km for a individual laser beam that is pointed at 0° and has 2 mW of power;

FIGS. 10a and 10b show the irradiance and phase of the wave front at 611 km for an individual laser beam that is pointed at 14° and has 2 mW of power;

FIG. 11a shows the irradiance at 611 km for two overlapping incoherent laser beams that are pointed at 0° and 0.075° and which both have 2 mW of power.

Figure 17D:
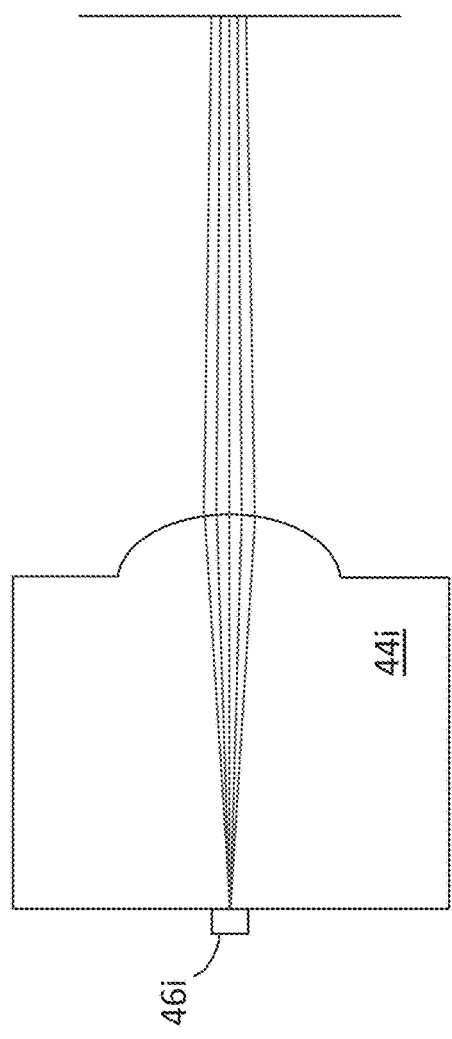
Figures 12, 13:
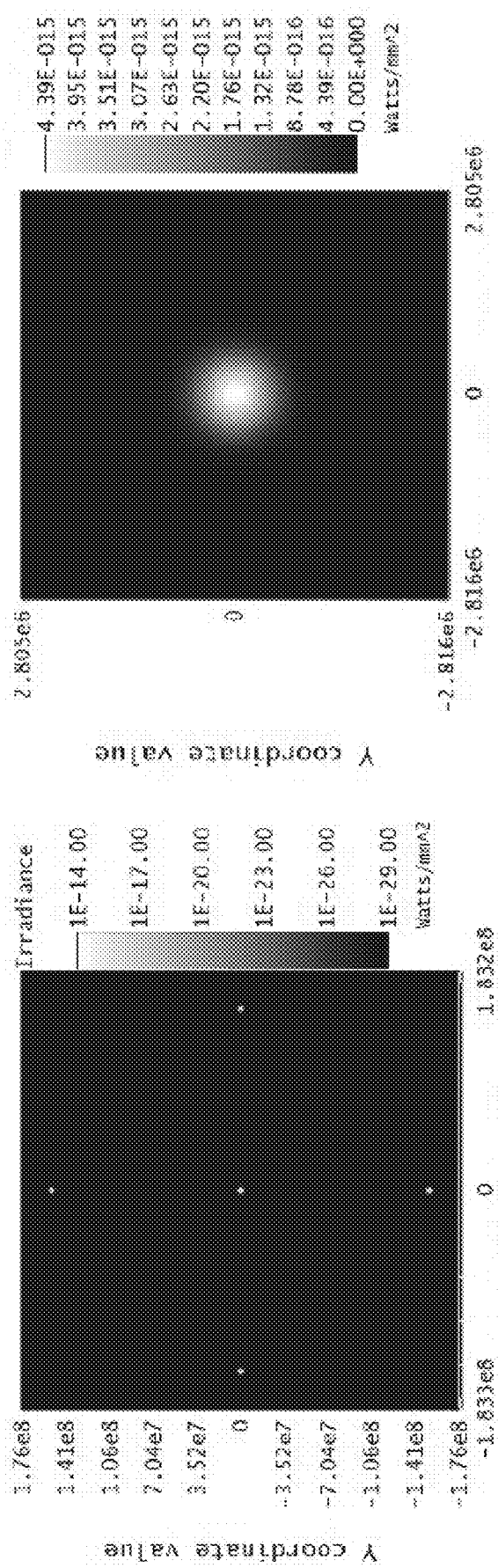
Figure 14:
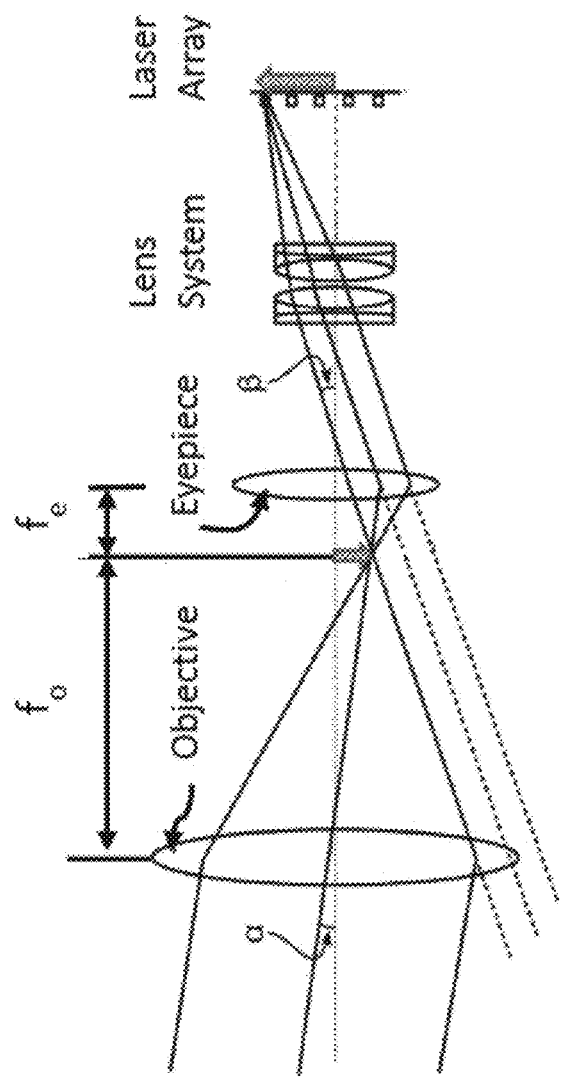
Figures 15A, 15B, 15C:
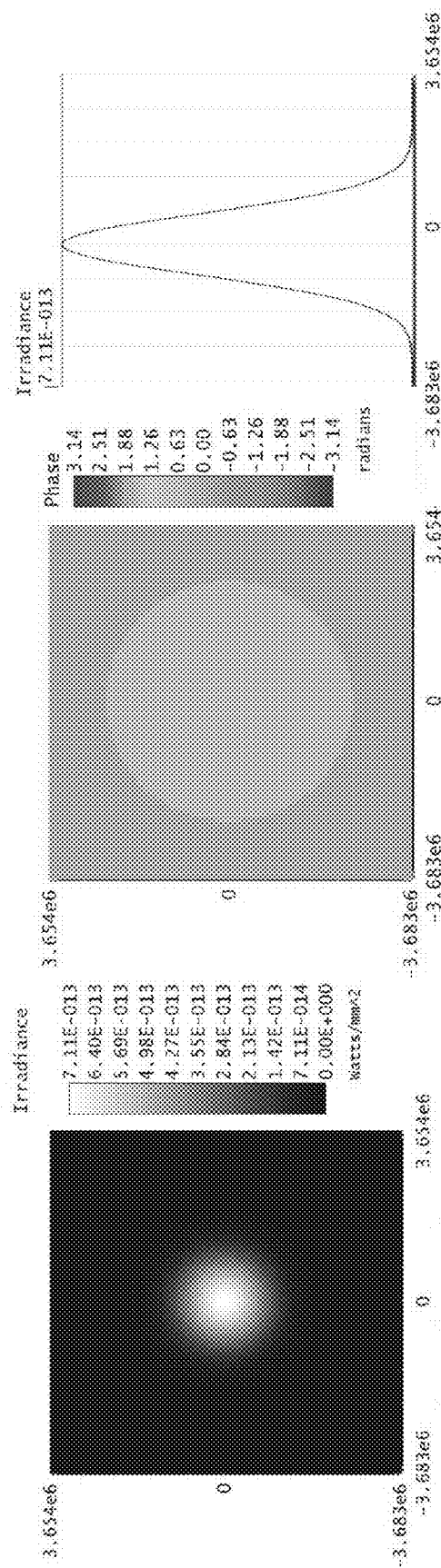
Figure 16:
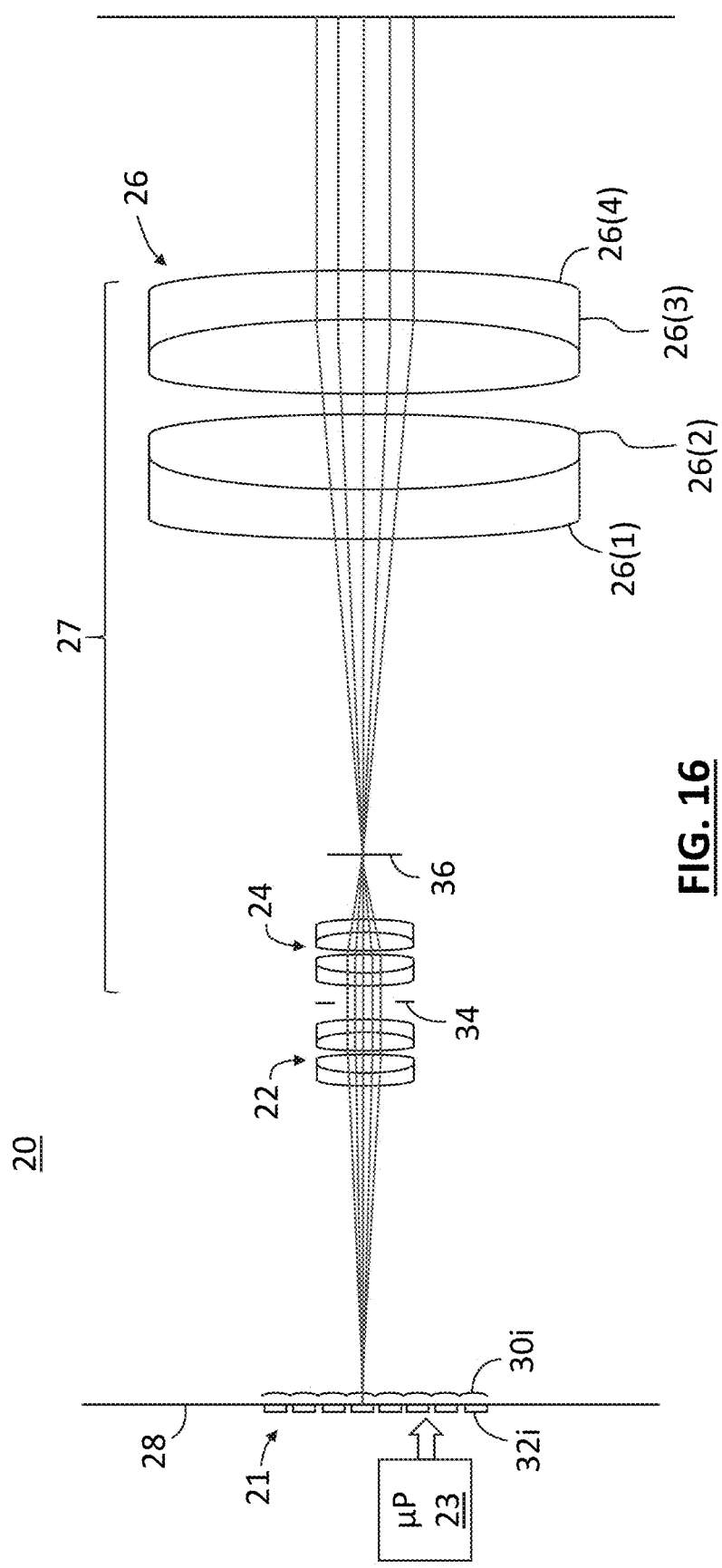
Figures 17A, 17B, 17C:
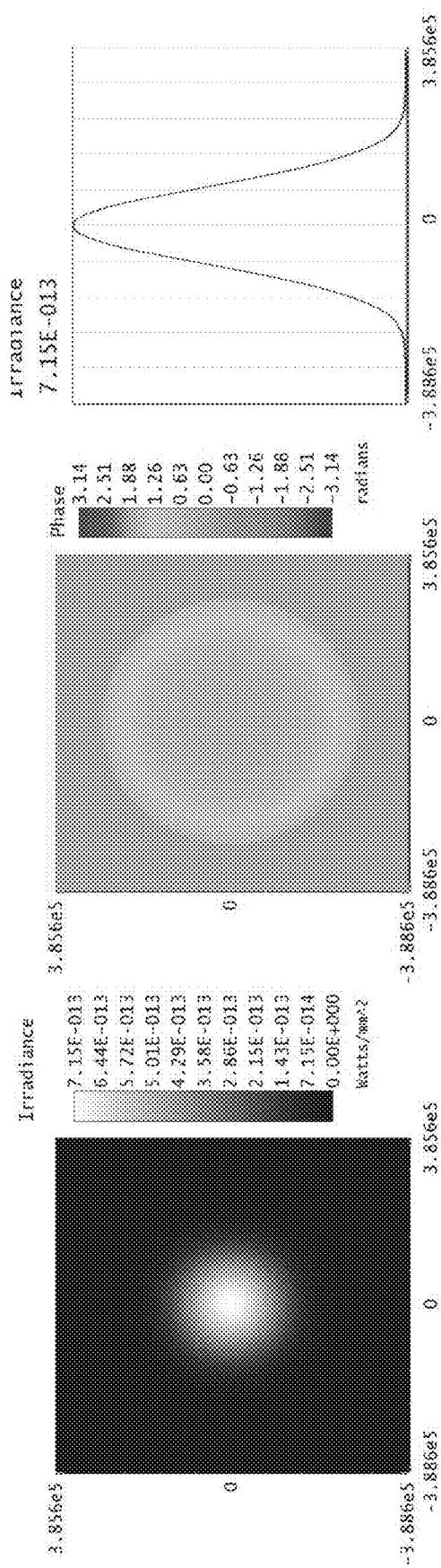
Figures 18A, 18B, 18C:
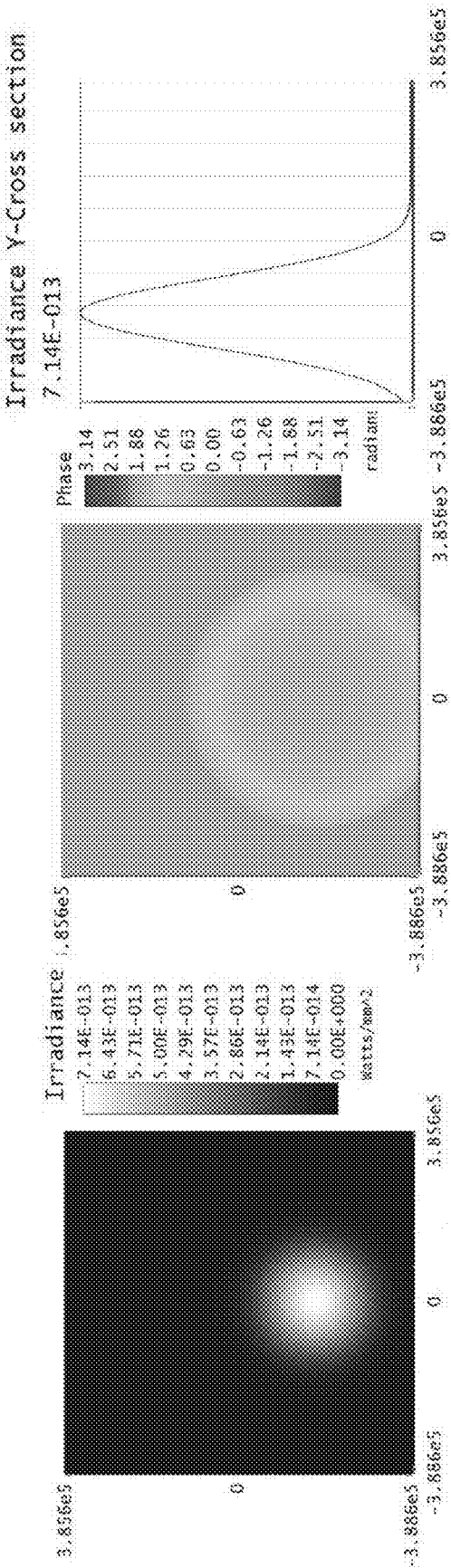
Figures 19A, 19B:
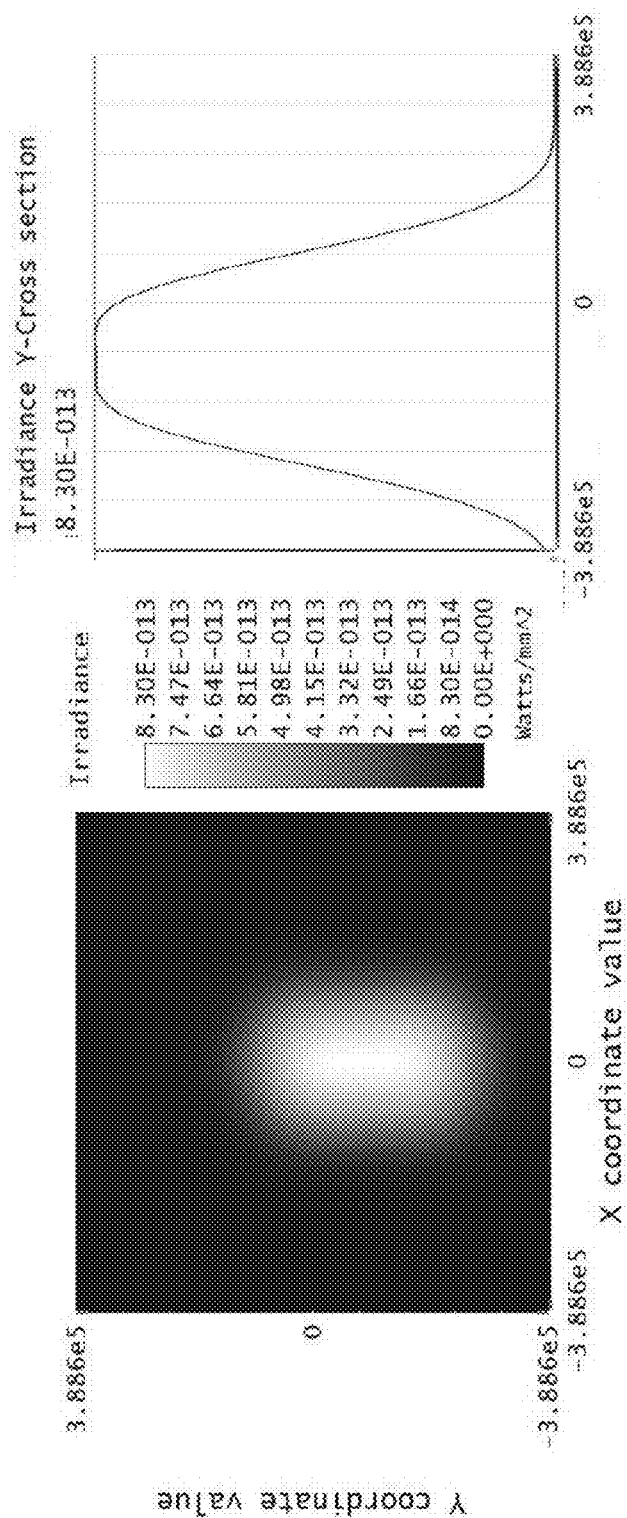
Figures 20A, 20B, 20C:
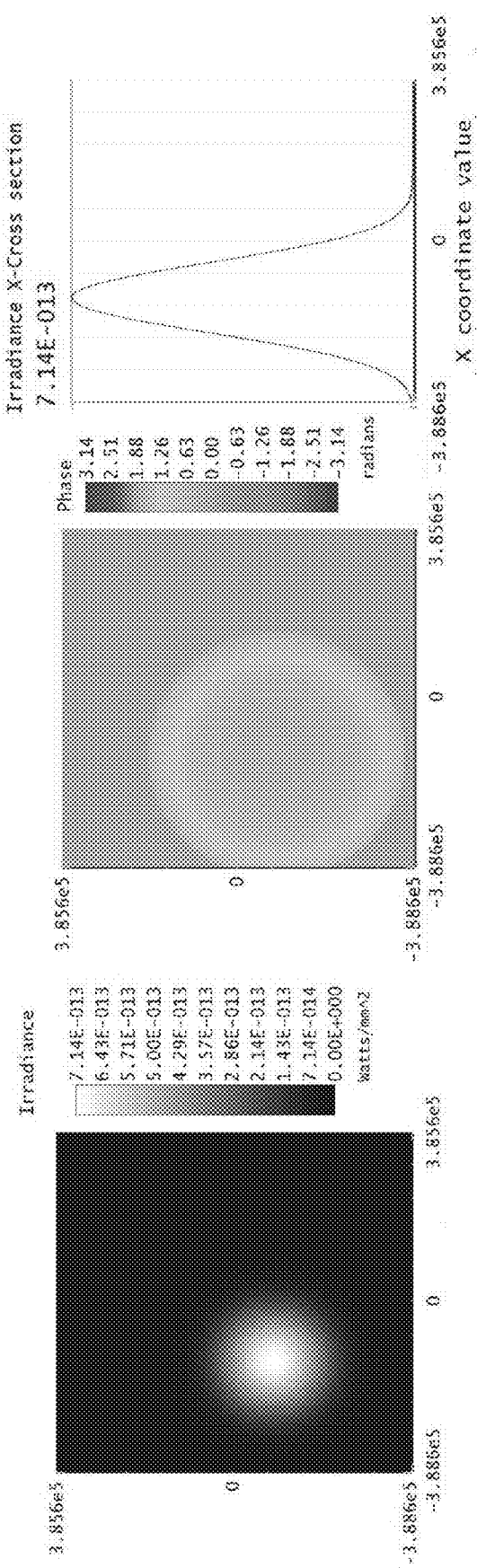
Figures 21A, 21B:
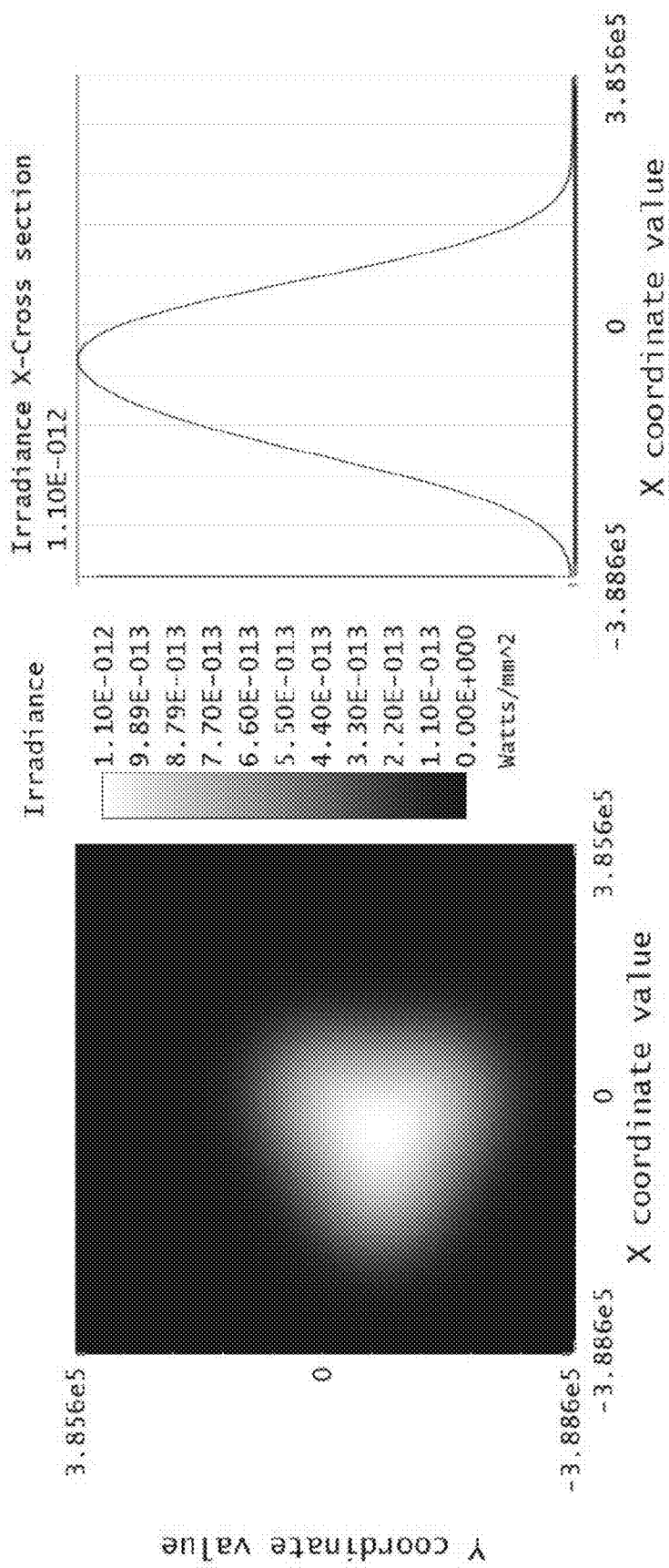
Figure 22:
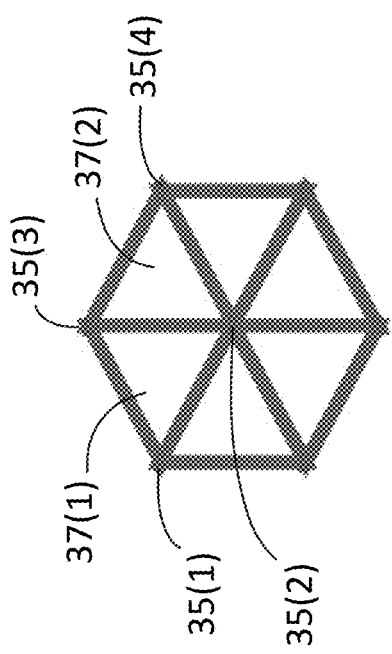
Figure 24B:
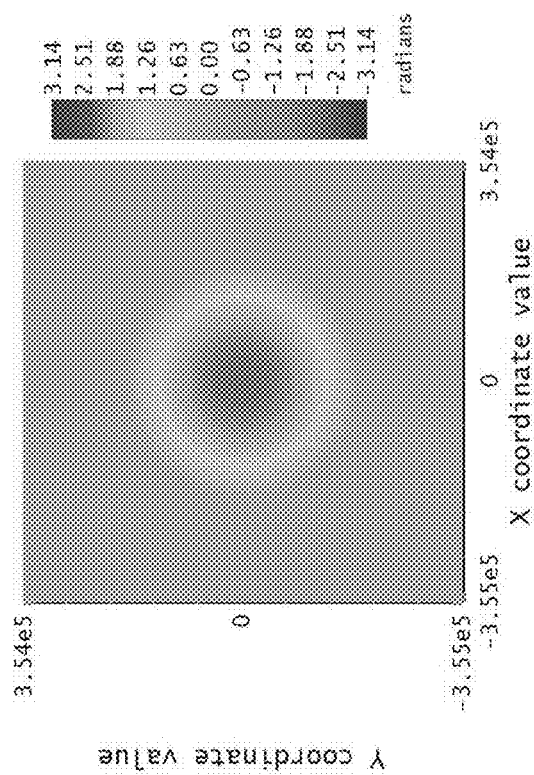
Figure 24A:
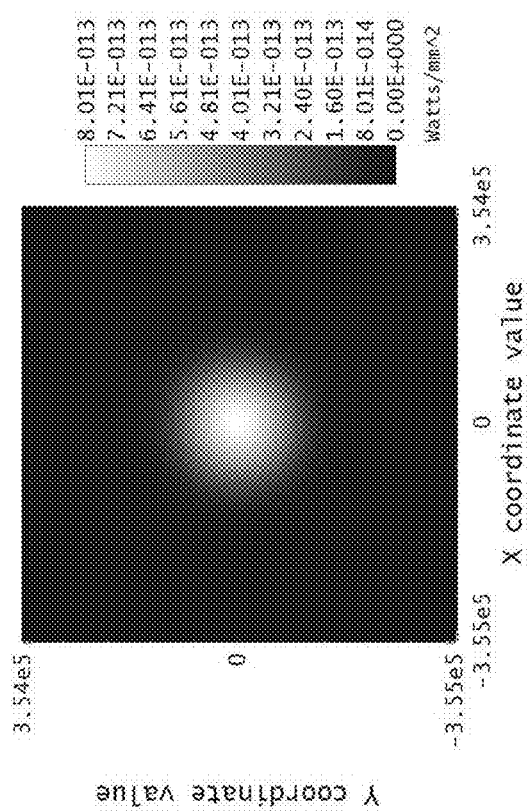
Figure 24C:
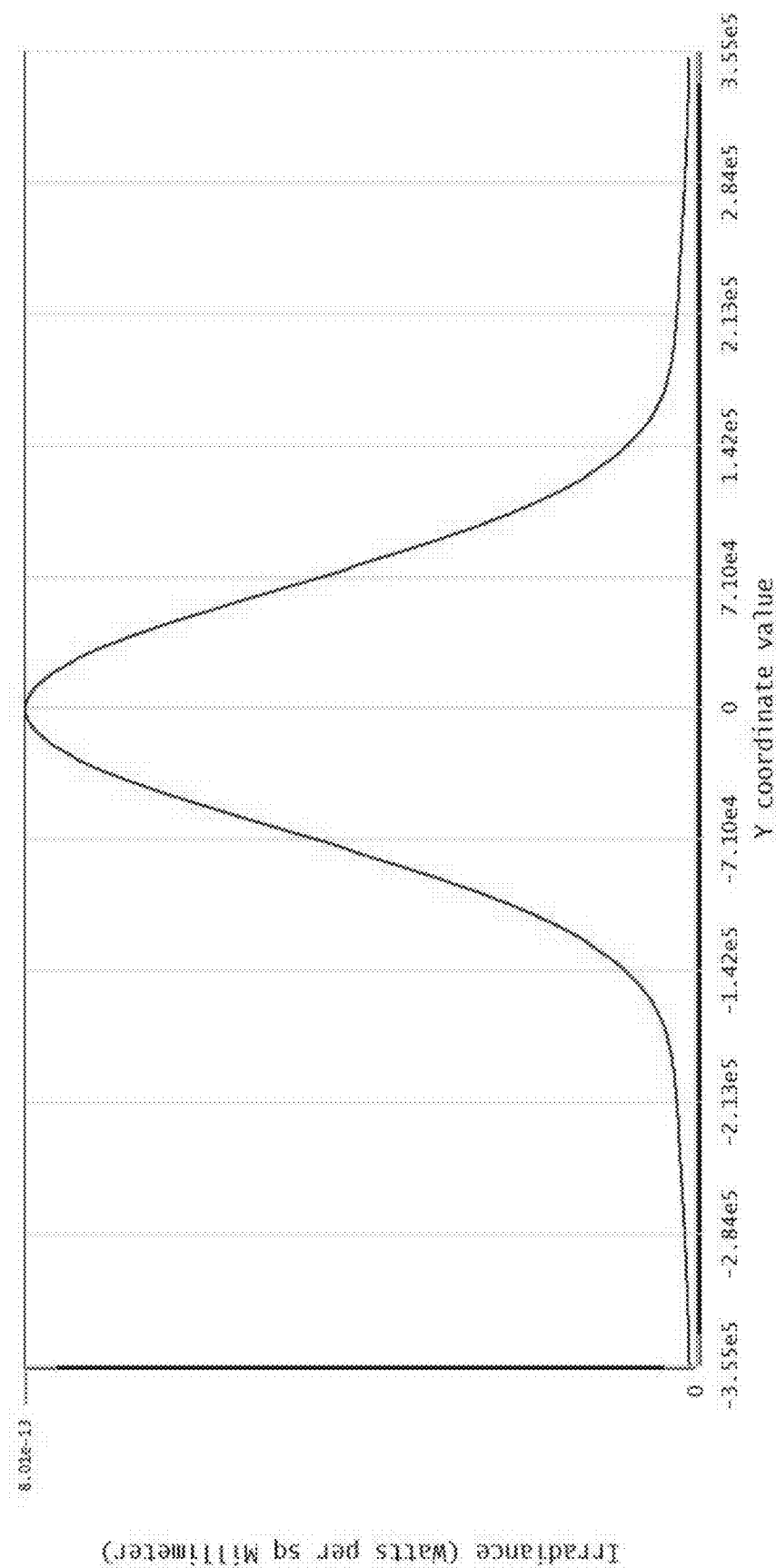

FIG. 11b shows the phase of the beam pointed at 0.075° of FIG. 11a;

FIG. 12 shows the irradiance at 611 km for 5 laser beams that are pointed at 0° and at ±14° in the x and y coordinate directions, and each has 2 mW of power, with AFOV Θ=28°, FOV (diameter) 304 km at 611 km;

FIG. 13 shows the irradiance from 2 lasers in a cluster pointed at 0°, which is about double that from one laser. The two beams overlap to form essentially one beam;

FIG. 14 shows a schematic lens design wherein a small telescope is placed in front of the lens/laser array system;

FIG. 15a shows the irradiance, FIG. 15b shows the phase, and FIG. 15c shows the y direction cross section of a wave front at 611 km for a laser beam, which has a divergence of 0.14° FWHM, in which the output power from the laser is 2 W;

FIG. 16 is a schematic diagram of an optical data transmission system 20 in accordance with certain embodiments;

FIG. 17a through 17c respectively show simulated irradiance and phase of a wave front at 611 km from system 20 from a laser located at x=0, y=0 μm in the laser array;

FIG. 17d is a view of microlenses 44i in accordance with certain embodiments;

FIGS. 18a through 18c show the irradiance and phase of a simulated wave front at 611 km from a laser located at x=0, y=−87 μm in the laser array;

FIGS. 19a and 19b show the results of a simulation when the two lasers are turned on together;

FIGS. 20a through 20c show the results of a simulation of a third emission, from a laser located at x=−75, y=−44 μm in the laser array;

FIGS. 21a and 21b show the resulting beam when the three laser clusters are turned on together;

FIG. 22 shows a pattern of VCSEL clusters and photodetectors for producing emissions such as a three-beam emission;

FIG. 23 is a schematic diagram of an alternative optical data transmission system 40 in accordance with certain embodiments; and FIGS. 24a and 24b respectively show a simulated irradiance and phase of a wave front, such as generated by a VCSEL or VCSEL cluster, at 611 km for the laser beam from system 40. FIG. 24c shows the irradiance has a Gaussian profile.

DESCRIPTION OF EXAMPLE EMBODIMENTS

Example embodiments are described herein in the context of an optical communication system and method using laser arrays. The following description is illustrative only and is not intended to be in any way limiting. Other embodiments will readily suggest themselves to those of ordinary skill in the art having the benefit of this disclosure. Reference will be made in detail to implementations of the example embodiments as illustrated in the accompanying drawings. The same reference indicators will be used to the extent possible throughout the drawings and the following description to refer to the same or like items.

In the description of example embodiments that follows, references to "one embodiment", "an embodiment", "an example embodiment", "certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. The term "exemplary" when used herein means "serving as an example, instance or illustration." Any embodiment described herein as "exemplary" is not necessarily to be construed as preferred or advantageous over other embodiments.

In the interest of clarity, not all of the routine features of the implementations described herein are shown and described. It will be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. Devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

Herein, reference to a computer-readable or machine-readable storage medium encompasses one or more non-transitory, tangible storage media possessing structure. As an example and not by way of limitation, a computer-readable storage medium may include a semiconductor-based circuit or device or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. § 101. Herein, reference to a computer-readable storage medium excludes transitory forms of signal transmission (such as a propagating electrical or electromagnetic signal per se) to the extent that they are not eligible for patent protection under 35 U.S.C. § 101. A computer-readable non-transitory storage medium may be volatile, nonvolatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

FIG. 1 schematically shows a system 10 in which a signal laser beam (solid or broken line rightward arrows), transmitted from a ground terminal on the left (not shown), enters a lens system 12 and is directed thereby to an element of a pixel array 14 disposed at the focal plane. Each element, or pixel 14a, consists of a VCSEL (Vertical Cavity Surface Emitting Laser) component/photodetector pair, shown in side view in FIG. 2 including details of its epi-structure. The photodetectors are p-type/intrinsic/n-type (PIN) detectors. In the system 10, the photodetectors detect the possibly weak signal beam, and the VCSEL component returns a strong modulated beam to the lens system 12 (solid or broken line leftward arrows), which sends it to the ground terminal. System 10 is configured optically such that an outgoing light beam emitted by a pixel 14a in response to a received incoming light beam is directed towards the source of that incoming light beam. As the signal beam changes direction, e.g., from the solid to the dashed lines, this change is detected by the photodetectors, and a laser adjacent to the detecting photodetector is turned on to keep the outgoing laser beam on target. Alternatively, a VCSEL component from a different element could send the returning beam along a slightly different outgoing path to account for "pointing ahead". The laser beams are incoherent to avoid interference effects. With incoherent outgoing beams from adjacent lasers, they can overlap so that the returning beam continues to point at the ground terminal without self-interference.

In the system of FIG. 1, the outgoing beam can be much stronger than the incoming signal beam, depending only on the power of the VCSEL. For various levels of outgoing power, the VCSEL component may consist of a single VCSEL or a cluster of VCSELs. The use of a cluster of VCSELs rather than a larger aperture VCSEL is to maintain the restriction to a single-mode laser beam. The VCSEL cluster will emit several incoherent beams that are all single-mode. This restriction is desirable to facilitate the detection of the beam at the receiver by avoiding multi-modes in the beam.

FIG. 3 is a diagram of a VCSEL/photodetector array pattern in accordance with certain embodiments. In this array the pitch, (i.e. the distance between elements), is the same for the VCSEL clusters 14b and the photodetectors 14c. Also, this packing pattern makes the distance between adjacent elements equal. Each VCSEL cluster comprises a plurality of VCSELs 14d.

FIG. 4 is top-view of a 37-element VCSEL/PIN detector array. VCSELs are shown as small black dots 14d and photodetectors are large white circles 14c.

FIG. 5 shows a simulation of the wave front of a 19-laser beam cluster at propagation distances of 1 km and 500 km. The unit of distance in the plane of the wave front is millimeters. The integrity of each individual beam of the cluster is maintained as it propagates from the lens system. The spot size of the wave front of the cluster and each of the individual one of the 19 laser beams is dependent on the propagation distance and the lens system. In addition, the spot size of the wave front of the cluster is dependent on the array parameters, such as the pitch, (i.e. distance between the centers of the individual lasers), and the spot size of the individual laser beams depends on the laser parameters, such as the aperture diameter of the individual lasers. The wavelength of the beam is 850 nm, which is a wavelength for which VCSELs are well developed for applications.

FIG. 6 shows schematically propagation through a relay lens system (diffraction limited) of two overlapping laser beams. As the direction of a target moves away from an active laser beam, as detected by the photodetectors, an adjacent laser is turned on to keep the laser beam on target and the first laser is turned off. Alternatively, multiple, e.g., three, lasers can be turned on to provide a peak intensity plateau.

FIG. 7 shows a Double Gauss 28° Field Lens system and the focusing at the focal plane of four beams (colors) that are incoming from the left side at different angles, including 0° (blue) and 14° (red). Each beam enters as collimated.

FIG. 8 shows laser beams being emitted from lasers at the focal plane and propagating out of the double Gauss 28° field lens system at several angles, including those at 0° and 14°. Each beam leaves as collimated. These outgoing beams have a wavelength of 850 nm. They are incoherent to avoid interference effects.

FIGS. 9a and 9b show the irradiance and phase of a wave front at 611 km for a individual laser beam that is pointed at 0° from a laser that has 2 mW of power and that is propagating out of the double Gauss 28° field lens system described above. The irradiance has a Gaussian profile, and the phase is essentially flat, so that this beam is diffraction-limited. The phase is shown for irradiance above 0.1%. Coordinates are in millimeters.

FIGS. 10a and 10b show the irradiance and phase of the wave front at 611 km for an individual laser beam that is pointed at 14° from a laser that has 2 mW of power and that is propagating out of the double Gauss 28° field lens system described above. The irradiance has a Gaussian profile, and the phase is essentially flat, so that this beam is diffraction-limited. Coordinates are in millimeters.

To account for the signal beam changing direction, a second laser may be turned on such that the two beams overlap. FIG. 11a shows the irradiance at 611 km for two overlapping incoherent laser beams that are pointed at 0° and 0.075° from lasers that both have 2 mW of power. The phase of the beam pointed at 0.075° is shown in FIG. 11b.

FIG. 12 shows the irradiance at 611 km for 5 laser beams that are pointed at 0° and at ±14° in the x and y coordinate directions, from lasers that each have 2 mW of power, with AFOV Θ=28°, FOV (diameter) 304 km at 611 km.

As mentioned above, the power of a beam can be increased by using a cluster of lasers (see FIG. 4). FIG. 13 shows the irradiance from 2 lasers which have 2 mW of power in a cluster pointed at 0°, which is about double that from one laser, and the two beams overlap to form essentially one beam.

The above configurations can be incorporated into a telescope to make the steering finer and consequently be applicable to transmissions between satellites in low-Earth orbit (LEO) and ground terminals. FIG. 14 shows a schematic lens design wherein a small telescope is placed in front of the lens/laser array system to reduce the angle β of the beam propagation emitted from the lens/laser array system to the smaller angle α of the beam propagation emitted from the objective lens of the telescope. Without the telescope, the spots from two adjacent laser beams from a satellite in LEO may not overlap on the Earth, so there would be a loss of coverage of the beam at the ground terminal as the direction from the lens system to the ground terminal changed. The telescope design details depend on the design parameters of the lens/laser array system, the distance to the ground terminal, the beam spot size, and the sensitivity of the ground receiver. The length of the system can be reduced by using two or more telescope lens system in series, since the total magnification of the complete system is equal to the product of the separate magnifications. The magnification of the telescope M=fo/fe, where fo is the focal length of the objective lens and fe is the focal length of the eyepiece lens. Also, $M=\beta/\alpha$, so that the angle of the outgoing beam is reduced for finer aiming.

One application of the arrangements described herein is to the OCSD (Optical Communication and Sensor Demonstration) program and can be used to augment a laser pointing system on a CubeSat that uses star trackers for body pointing. (A secondary approach would be to use an uplink ground laser beacon and an onboard quad cell for closed-loop pointing.) The lens system provides a fine pointing capability to the OCSD lens system. With the more accurate pointing, the power requirement would be substantially reduced and the resulting thermal load also reduced, thereby mitigating the current thermal load challenge.

The OCSD mission utilized two CubeSats AeroCube-7B&C, with divergences of the output beams set conservatively to be ~0.06° and 0.15° FWHM, respectively. A divergence of 0.14° FWHM used in computer simulations of the propagation of a laser beam for a LEO distance of 611 km, in order to obtain a spot size diameter at FWHM of 1600 m at the image plane, shows that the power requirement of the beam can be reduced from 2 W to 90 mW using the arrangements described here. Specifically, FIG. 15a shows the irradiance and FIG. 15b shows phase of a wave front at 611 km for a laser beam, which has a divergence of 0.14° FWHM, and the case in which the output power from the laser is 2 W. A wide-angle lens, double Gauss with 28° field, such as that of FIGS. 7 and 8, is used. The peak irradiance of the beam is 7.11E-13 W/(mm)$^2$. The irradiance has a Gaussian profile, and the phase is essentially flat, as seen in FIG. 15c, so that this beam is diffraction limited. The units for the distances are in mm and the spot size is about 1600 m.

FIG. 16 is a schematic diagram of an optical data transmission system 20 in accordance with certain embodiments. It comprises three lens systems 22, 24, 26, each having four lens elements. These four lens elements consist of two doublets, with the left doublet's elements in reverse order from that of the right doublet. The four-element lens systems 22, 24 and 26 are each an example of a modern version of a symmetrical Plössl lens. The Plössl lens is a simpler lens system than the double-Gauss lens, which has six lens elements, although the use of the double-Gauss is also contemplated. As used herein, the term "Plössl lens" denotes the four-element lens system, such as any of lens systems 22, 24, or 26. Similarly, as used herein, the term "double-Gauss lens" denotes the six-element lens system shown in FIGS. 7-8. Lens systems 24 and 26 respectively form an eyepiece and objective of a telescope assembly 27, and the doublets of objective 26 are labeled 26(1), 26(2), 26(3) and 26(4). In certain embodiments, the small middle eyepiece lens system 24 is a reduction of the right objective lens system 26 by a factor of sixteen; so that the telescope 27 is effectively a miniature telescope with a magnification factor of sixteen. The left lens system 22 converts the diverging beam from the focal plane 28 where the laser array is located, to a collimated beam for entry into system 24 (eyepiece) of the telescope system 27. System 22 retains the focal length of the right system 26 (objective) to minimize the angles of laser beams from the laser array to the vertex of the first surface of that lens system 22. System 20 includes an optoelectronic assembly 21 having an array of VCSELs 32i, an array of microlenses 30i each corresponding to a VCSEL, and a plurality of photodetectors (see FIG. 22) that selectively activate emission from one or more VCSELs based on light sensed by one or more photodetectors. Control of the photodetectors and the selective emission by the VCSELs 30i can be effected by a microprocessor (μP) 23 or the like. The VCSELs 32i can be selected for emission individually or in groups or clusters, and in any desired sequence or physical or temporal pattern, as detailed herein. The microlenses 30i in front of each VCSEL 32i serve to narrow the emerging beam and point it to the center of the lens system stop 34, which is located between the first (22) and second (24) lens systems. The focal plane 36 is where the middle lens system 24 (eyepiece) focuses the beam. In certain embodiments, the distances from the last surface of the middle lens system 24 to the focal plane 36, and from the focal plane to the first surface of the right lens system 26, denote approximately fe, the focal length of eyepiece lens system 24, and fo, the focal length of objective lens 26, respectively. The telescope's effect is to reduce the divergence of the beam and broaden the beam, both by the magnification of the telescope M=fo/fe, a factor of sixteen.

In certain embodiments, the length of system 20, from the focal plane 28 at which the lasers 32i (and detectors, not shown) are located, to the distal apex of the distalmost lens of the objective lens system 26, is about 6.2 cm. The diameter of the objective lens system 26 is about 2.5 cm. The beam diameter at the last lens surface is about 1.4 mm FWHM. The length (apex-to-apex) of the objective lens system 26 is about 2.1 cm. The focal length of objective lens system 26, defined as the distance between focal plane 36 and the apex of a surface of lens system 26 proximalmost thereto, is about 1.8 cm. In certain embodiments, the diameters of the two lens systems 22 and 24 are substantially the same. In certain embodiments, these diameters are each about 1.6 mm, and the length (thickness) of each of the lens systems 22, 24 is about 1.3 mm. The focal length of lens system 22, defined as the distance between image plane 28 and the apex of a surface of the lens system 22 proximalmost thereto, is about 1.8 cm. The focal length of lens system 24, defined as the distance between image plane 28 and the apex of a surface of the lens system 24 proximalmost thereto, is about 1.5 cm.

FIGS. 17a and 17b respectively show a simulated irradiance and phase of a wave front, such as generated by a VCSEL or VCSEL cluster, at 611 km for the laser beam from system 20. The laser beam has a divergence of 0.0174° FWHM (full width at half maximum) and the diameter of the spot size at the image plane is about 200 m. The output power from the laser cluster is 30 mW, and the peak irradiance of the beam is 7.15E-13 W/(mm)$^2$, which is almost the same as the 7.11E-13 W/(mm)$^2$ for the 2 W beam with the divergence of 0.14° FWHM described above with reference to FIGS. 15a and 15b. The irradiance has a Gaussian profile (FIG. 17c), and the phase is essentially flat, so that this beam is diffraction limited. The units for the distances are in mm.

In certain embodiments, a combination of two or three or more beams can be deployed. The resulting combined beam will form a plateau at the peak, so that changes in direction of that beam with respect to the receiver will not affect the intensity of the beam at the receiver, as long as the receiver is within the plateau area. This insensitivity may not be possible if just one beam is transmitted. The results in FIGS. 17a through 17c are for a VCSEL or VCSEL cluster in the array at the focal plane of the first lens system 22 whose center is located on the axis of the lens system, so the x and y coordinates of the center in the focal plane are x=y=0. Consider a two-beam emission, taking the coordinates of the two VCSEL or VCSEL clusters to be at x=0 and y=0 μm and at x=0 and y=−87 μm respectively—that is, a pitch of 87 μm. The irradiance and phase of a simulated wave front at 611 km for the laser beam located at x=0, y=−87 μm are shown in FIGS. 18a through 18c. The output power from the laser cluster is 30 mW and now the peak irradiance of the beam is 7.14E-13 W/(mm)$^2$. The center of the beam is about 200 m down from the center of the other beam from the laser located at x=0, y=0 μm, whose irradiance has a Gaussian profile, and phase is essentially flat, and is therefore diffraction limited.

FIGS. 19a and 19b show the results of a simulation when the two lasers are turned on together; that is, the beam is the combination of the two incoherent beams shown in FIGS. 17a-c and 18a-c. There is a plateau region formed by the two laser beams. There is no phase plot since the beams are incoherent. The output power from the two laser clusters is 60 mW.

FIGS. 20a through 20c show the results of a simulation of a third emission, from x=−75, y=−44 μn, to be added to the two above, in an equilateral triangle configuration. Similarly to the two-beam case, the irradiance for the beam has a Gaussian profile (FIG. 20c), and the phase (FIG. 20b) is essentially flat, so that this beam is diffraction limited. The center of the beam is equidistant from the centers of the beams in FIGS. 17a-c and 18a-c.

FIGS. 21a and 21b show the resulting beam when the three laser clusters are turned on together; the beam is the combination of the three incoherent beams shown in FIGS. 17a-c, 18a-c, and 20a through 20c. They illuminate a triangular area. There is no phase plot since the beams are incoherent. In FIG. 21b, the x-coordinate cross-section is taken at a y value half way between the centers of the two beams in FIG. 19a, at which y=−100 m. The output power from the three laser clusters is 90 mW. With three beams the pitch can be increased or the power of the lasers can be reduced and a plateau region will be produced.

FIG. 22 shows a pattern of VCSEL clusters and photodetectors for producing emissions such as the three-beam emission above and used for coupling the detection of the incoming signal beam with the transmission of the outgoing beam in accordance with certain embodiments. In this arrangement, VCSEL clusters are disposed at the vertices of triangular-shaped photodetectors that are substantially contiguous with one another (save for any necessary electrical isolation between them). In this example arrangement, the detection of an incoming signal beam by a photodetector element 37 turns on the VCSEL clusters 35 at the vertices of that that photodetector element. For example, as the signal beam changes direction and first photodetector 37(1) and then photodetector 37(2) are impinged, VCSEL 35(1) of emitting triad 35(1), 35(2), 35(3) is turned off, and VCSEL cluster 35(4) is turned on to form a new emitting triad 35(2), 35(3), 35(4).

As seen from the above, the three-laser cluster arrangement of FIGS. 21a-21b has combined output power of 90 mW (3×30 mW). The spot size of each beam is 200 m, and a distance of 200 m between centers of the spots assures a plateau region at the peak intensity. With three lasers, a distance of 200 m between the centers of the spots produces a peak intensity greater than that exhibited by the FIG. 15a and FIG. 15b arrangement, so the distances between the three laser beam centers can be increased or the powers can be decreased. By increasing the number of photodetector elements 37 in the arrangement of FIG. 22 but keeping the pattern the same, so that there are 64 photodetector elements and 42 VCSEL clusters 35, the area covered by all the beams would cover the area covered by the beam shown in FIG. 15a and FIG. 15b. When a photodetector element 37 detects an incoming signal beam, the three VCSEL clusters 35 at its vertices are turned on. A VCSEL cluster can for example consist of seven VECELs, each with a power of about 4 mW. This fine pointing capability augments the pointing system in AeroCube-7C for example. With more accurate pointing, the power requirement for the laser beam is reduced and the resulting thermal load is commensurately reduced. This fine pointing device is static and maintains the avoidance of a fine pointing addition that uses moving parts such as a gimbal and a fast steering mirror. The OCSD mission utilized two CubeSats AeroCube-7B&C. The divergences of the output beams for 7B and 7C were set conservatively to be ~~0.06° and 0.15° FWHM, respectively. Using the fine pointing method described herein to cover the area covered by AeroCube-7B, which is about 6.25 times smaller, the power in each VCSEL cluster could be reduced to about 12 mW from 30 mW by reducing the area covered by each VCSEL cluster similarly. In a cluster of seven VCSELs, the power output in each VCSEL is reduced from about 4 mW to 2 mW. Alternatively, the number of PIN elements and VCSEL clusters can be reduced.

FIG. 23 is a schematic diagram of an alternative optical data transmission system 40 in accordance with certain embodiments. System 40 is simpler than system 20 (FIG. 16) in that it uses fewer optical components and is more compact and inexpensive to build and maintain. System 40 primarily includes an objective lens system 42, having a symmetrical Plössl design similar to objective lens system 26 (FIG. 16), and microlens array 44 for directing laser light from laser array 46, narrowing the emerging laser beams and directing them towards the objective. The lasers 46i of the array are VCSELs that can be activated by microprocessor 43 individually or in clusters based on signals from the photodetectors (not shown) as described above. Use of a double-Gauss lens in lieu of the Plössl lens design for the objective is also contemplated. System 40 is shown as part of a communication device 45, disposed for example on earth or on a satellite, and having an output aperture 47 from which to receive incoming light or deliver outgoing light, for example to a distant terrestrial or celestial (e.g. satellite) station 49.

In certain embodiments, the length of system 40, from the focal plane 48 at which the laser array 46 and microlens array 44 are located, to the distal apex of the distalmost lens of the objective lens system 42, is about 3.9 cm. The diameter of objective lens system 42 is about 2.5 cm, its length (apex-to-apex) is about 2.1 cm, and its focal length is about 1.8 cm. In certain embodiments, the microlenses 44i shown schematically in FIG. 17a each have a height of about 40 μm, a width of about 40 μm, and a radius of curvature on the right side of about −0.012 μm. The lasers 46i have a laser aperture of about 5 μm.

FIGS. 24a and 24b respectively show a simulated irradiance and phase of a wave front, such as generated by a VCSEL or VCSEL cluster, at 611 km for the laser beam from system 40. The laser beam has a divergence of 0.0174° FWHM (full width at half maximum) and the diameter of the spot size at the image plane is about 200 m. The output power from the laser cluster is 30 mW, and the peak irradiance of the beam is 8.01E-13 W/(mm)$^2$. The irradiance has a Gaussian profile (FIG. 24c), and the phase is substantially flat, so that the beam is diffraction limited.

The VCSEL and VCSEL array arrangements described herein can operate at data rates of 1 Gb/s higher. There are recent developments in increasing data rates for VCSELs to provide 25 Gb/s data rates, and even 100 Gb/s.

While arrangements of with output powers around 4 mW in clusters of seven elements with output power of about 30 mW were described, VCSELs and VCSEL arrays with much higher powers, with output peak powers of 160 W and pulse widths of 7.2 ns (FWHM), and others with output powers of almost 10 kW. Thus laser beams for space optical communications that require more power, such as a few watts, can be obtained with VCSEL clusters with more elements or with VCSELs with larger apertures.

Other contemplated applications relate to recent developments for an inter-satellite omnidirectional optical communicator (ISOC) that will enable up to 1 Gbps data rates over a distance up to 200 km in free space. Key features of the ISOC include full sky coverage and its ability to maintain multiple links simultaneously. The ISOC outer frame is a truncated icosahedron small enough to deploy out of a CubeSat. The frame contains photodetector receivers and gimbal-less scanning MEMS mirrors for transmit beam steering. There are miniature transmitter housings ("telescopes") that include a single mode laser diode and a MEMS mirror. The frame's vertices feature fast photodetectors for reception and direction finding. To operate MEMS mirrors, voltages of around 10 V to around 100 V are used.

Also contemplated is use with two steering MEMS mirrors that require less voltage, around hundreds of mV. The mirrors provide the pointing over the larger angles and the arrangement described herein, such as systems 20 and 40 above, provide the fine pointing on a nanosecond time scale. The random angular disturbance caused by satellite vibration would be taken care of electronically by the described VCSEL-photodetector array, also on a nanosecond time scale.

The arrangements described herein are extendable to longer, planetary distances. The size of the lens system may need to be scaled up and the power of the laser clusters increased. At such large distances it may be crucial to isolate the optical transceiver assembly from base platform vibrational disturbances by an isolation pointing assembly, since any minor shift in direction would cause the laser beam to miss the receiver. However, with the use of a lens system/ VCSEL-photodetector array system to provide fine pointing, the effects of vibrational disturbances would be mitigated on a nanosecond time scale.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted based on the foregoing description. This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. An optical communication system comprising:
   i) an optoelectronic assembly including:
      (a) an array of VCSELs, wherein the VCSELs are arranged in clusters and all VCSELs of a cluster are activated for simultaneous emission,
      (b) an array of microlenses each corresponding to one or more VCSELs of the array of VCSELs,
      (c) a plurality of photodetectors each configured to generate an output signal in response to detected light, and
      (d) a processor for selectively activating emission from one or more VCSELs of the array of VCSELs based on output signals from the photodetectors;
   ii) a first lens system, comprising a Plössl lens or a double-Gauss lens, for directing light to or from the optoelectronic assembly; and
   iii) a telescopic lens assembly for directing light to or from the first lens system, the telescopic lens assembly having second and third lens systems respectively forming an eyepiece and an objective of the telescopic lens assembly, at least one of the eyepiece or objective comprising a Plössl lens or a double-Gauss lens.

2. The system of claim 1, wherein multiple clusters of VCSELs are activated for simultaneous emission.

3. The system of claim 2, wherein the number of clusters activated for simultaneous emission is three.

4. The system of claim 3, wherein the three clusters are arranged in an equilateral triangle.

5. The system of claim 1, wherein the photodetectors are substantially triangular in shape, with each VCSEL cluster being disposed at a vertex.

6. The system of claim 1, wherein the emission is at about 30 mW.

7. The system of claim 1, wherein the emission is at about 60 mW.

8. The system of claim 1, wherein the emission is at about 90 mW.

9. An optical communication device comprising:
   i) an optoelectronic assembly including:
      (a) an array of VCSELs, wherein the VCSELs are arranged in clusters and all VCSELs of a cluster are activated for simultaneous emission,
      (b) an array of microlenses each corresponding to one or more VCSELs of the array of VCSELs,
      (c) a plurality of photodetectors each configured to generate an output signal in response to detected light, and
      (d) a processor for selectively activating emission from one or more VCSELs of the array of VCSELs based on output signals from the photodetectors; and
   ii) a lens system, comprising a Plössl lens or a double-Gauss lens, for directing light to or from the optoelectronic assembly; and
   iii) an aperture in optical communication with the lens system for conveying light between the optical communication device and a remote station.

10. The device of claim 9, wherein multiple clusters of VCSELs are activated for simultaneous emission.

11. The device of claim 10, wherein the number of clusters activated for simultaneous emission is three.

12. The device of claim 11, wherein the three clusters are arranged in an equilateral triangle.

13. The device of claim 9, wherein the photodetectors are substantially triangular in shape, with each VCSEL cluster being disposed at a vertex.

14. A method for optical communication with between a device and a remote station, the method comprising:
   i) passing light incoming from the remote station and outgoing to the remote station through a lens system and an aperture of the device, the lens system comprising a Plössl lens or a double-Gauss lens;
ii) receiving the incoming light at an optoelectronic assembly of the device, the optoelectronic assembly including:
   (a) an array of VCSELs, wherein the VCSELs are arranged in clusters and all VCSELs of a cluster are activated for simultaneous emission,
   (b) an array of microlenses each corresponding to one or more VCSELs of the array of VCSELs, and
   (c) a plurality of photodetectors each configured to generate an output signal in response to detected light; and
iii) selectively activating emission of the outgoing light from one or more VCSELs of the array of VCSELs based on output signals from the photodetectors.

15. The method of claim 14, wherein multiple clusters of VCSELs are activated for simultaneous emission.

16. The method of claim 15, wherein the number of clusters activated for simultaneous emission is three.

17. The method of claim 16, wherein the three clusters are arranged in an equilateral triangle.

18. The method of claim 14, wherein the photodetectors are substantially triangular in shape, with each VCSEL cluster being disposed at a vertex.

* * * * *